United States Patent [19]
Gardner et al.

[11] Patent Number: 5,994,175
[45] Date of Patent: Nov. 30, 1999

[54] HIGH PERFORMANCE MOSFET WITH LOW RESISTANCE DESIGN

[75] Inventors: Mark I. Gardner, Cedar Creek; H. Jim Fulford; Derick J. Wristers, both of Austin, all of Tex.

[73] Assignee: Advanced Micro Devices, Inc., Sunnyvale, Calif.

[21] Appl. No.: 08/924,781

[22] Filed: Sep. 5, 1997

[51] Int. Cl.$^6$ ................................................ H01L 21/8238
[52] U.S. Cl. .......................... 438/199; 438/303; 438/305; 438/307
[58] Field of Search ..................................... 439/199, 303, 439/305, 307, FOR 168, FOR 204, FOR 216, FOR 217

[56] References Cited

PUBLICATIONS

Sze, S.M., *Physics of Semiconductor Devices*, John Wiley & Sons, Inc., New York, 1981, pp. 431–486.

*Primary Examiner*—John Niebling
*Assistant Examiner*—Long Pham
*Attorney, Agent, or Firm*—Kevin L. Daffer; Conley, Rose & Tayon

[57] ABSTRACT

A manufacturing process in which semiconductor transistors are fabricated using a fluorine or nitrogen implant into the n-channel regions and an amorphization implant to beneficially limit the spreading of the source/drain impurity distributions thereby decreasing the junction depth and increasing the sheet resistance of the source/drain regions. Broadly speaking, a gate dielectric layer is formed on a semiconductor substrate. First and second conductive gate structures are then formed on an upper surface of the gate dielectric layer. The first conductive gate is positioned over the p-well region while the second conductive gate is positioned over the n-well region. An n-channel mask is then formed on the substrate and a first impurity distribution is introduced into the p-well regions. The first impurity distribution preferably includes a species of fluorine or nitrogen. A n-type impurity distribution is then introduced into the p-well regions of the semiconductor substrate. A p-channel mask is then formed on the semiconductor substrate. After the p-channel mask is formed, a p-type impurity distribution such as boron is introduced into the n-well regions and into the second conductive gate structure. An electrically neutral impurity is then introduced into the semiconductor substrate to amorphize the semiconductor substrate to limit the subsequent redistribution of source/drain impurity distributions thereby resulting in the formation of shallow junctions. Thereafter, spacer structures are formed on sidewalls of the first and second conductive gate structures, and forming the spacer structures, n+ and p+ source/drain impurity distributions are introduced into the p and n well regions of the semiconductor substrate respectively.

20 Claims, 3 Drawing Sheets

HIGH PERFORMANCE MOSFET WITH LOW RESISTANCE DESIGN

BACKGROUND OF THE INVENTION

1. Field of the Invention

The present invention relates to the field of semiconductor processing and more particularly to improving the performance of shallow junction MOS transistors.

2. Description of the Relevant Art

MOS Circuits are widely used in the electronics industry for an extremely broad range of applications including microprocessors, integrated circuit memories, and applications specific logic products. The basic building block of the MOS integrated circuit is the MOS transistor. FIG. 7 shows a typical embodiment of a single MOS n-channel transistor. MOS transistor 10 includes a lightly doped p-type semiconductor substrate 12, a gate dielectric 16 formed on substrate 12, a conductive gate 14 formed on the gate dielectric, n-type source region 18, and n-type drain region 20. The operation of, and I-V, characteristics of transistor 10 are well known. With no bias applied to conductive gate 14, a reversed bias p-n junction exists between drain region 20 and channel region 22 such that the current flow from drain region 20 to source region 18 is negligible. If, however, a positive bias is applied to conductive gate 14, mobile carriers within channel region 22 of p-type substrate 12 are repelled from the surface leaving behind a depletion region of uncompensated donor ions. If conductive gate 14 is further biased, minority carriers (i.e. electrons) are attracted to channel region 22 of substrate 12 to form a conductive inversion region near the upper surface of semiconductor substrate 12 in channel region 22. The bias required to induce an electron concentration near the surface of substrate 12 approximately equal to the whole concentration in the bulk of semiconductor substrate 12 is referred to as the threshold voltage ($V_t$). With a threshold voltage $V_t$ applied to conductive gate 14, the conductive channel in channel region 22 permits current flow from drain region 20 to source region 18 if an appropriate bias is applied to drain region 20. For small values of drain voltage $V_d$ (i.e. $V_d < V_g - V_t$) the current ($I_{ds}$) that flows from drain region 20 to source region 18 varies approximately linearly with the drain voltage $V_d$. For large values of drain voltage (i.e. $V_d < V_g - V_t$), Ids is independent of $V_d$ to a first order approximation. Applying a gate $V_g$ that is less than the threshold voltage $V_t$ induces a weak inversion region is induced in channel region 22 of semiconductor substrate 12 permitting a small but measurable subthreshold current to flow from source to drain. Subthreshold currents are particularly important in low voltage, low power applications such as MOS integrated circuits because of the large number of transistors in the integrated circuit and because the subthreshold region determines the manner in which the transistors turn on and off.

MOS transistors may be broadly characterized as either short channel or long channel devices. In a long channel device, the sub-threshold current is independent of the drain voltage, the threshold voltage is independent of the channel length and the transistor biasing, and the drain current in the saturation region is independent of the drain voltage. It will be appreciated that these characteristics of long channel devices are desirable from a manufacturing and circuit design perspective because of their tendency to minimize subthreshold currents and threshold voltage variation among transistors of varying dimensions. In contrast to long channel devices, short channel devices are characterized by a subthreshold current that varies with drain voltage, a threshold voltage that varies with channel length and the biasing conditions, and a failure of current saturation in the saturation region. A useful equation has been derived that predicts the minimum channel length which can be expected to result in long channel subthreshold behavior for a given set of process parameters. See, e.g., S. M. Sze., *Physics of Semiconductor Devices* pp. 431–86 (John Wiley and Sons, 1981). A minimum channel length for long channel operation depends primarily upon the gate oxide thickness, the substrate doping, the drain voltage, and the junction depth of the source/drain regions. Sze, supra, at 471. Other parameters being equal, the minimum channel length for long channel operation varies with the cube root of the junction depth. As the channel length of MOS transistors has been reduced through advancements in photolithography and other semiconductor processing techniques, the significance of the subthreshold characteristics and the efforts to minimize subthreshold effects have been correspondingly increased. Unfortunately, the conventional methods of forming source region 18 and drain region 20 of transistor 10 has provided a source of frustration for process designers attempting to minimize short channel effects. Typically, source region 18 and drain region 20 of transistor 10 are fabricated by an ion implantation technique in which ions of appropriate impurities, or boron are implanted into semiconductor substrate 12. Even when used in conjunction with a dielectric layer formed on the surface prior to the implantation, the ion implantation process typically results in a junction depth x that places a lower limit on the minimum channel device that can be fabricated with long channel characteristics. In addition, processing subsequent to the ion implantation process typically redistributes the ion implantation distributions such that the as implanted junction depth is less than the junction depth that exists at the completion of the fabrication process. Accordingly, efforts to minimize short channel effects in MOS transistors in the submicron range have been greatly constrained by the minimum junction depth x typically available with the standard MOS transistor formation process. It would therefore be highly desirable to implement a fabrication process in which the junction depth of the MOS transistor could be significantly reduced without undesirably altering other transistor parameters.

SUMMARY OF THE INVENTION

The problems identified above are in large part addressed by a manufacturing process in which semiconductor transistors are fabricated using a fluorine or nitrogen implant into the n-channel regions and an amorphization implant to beneficially limit the spreading of the source/drain impurity distributions thereby decreasing the junction depth and increasing the sheet resistance of the source/drain regions. Broadly speaking, the present invention contemplates a semiconductor process in which a gate dielectric layer is formed on a semiconductor substrate. The substrate typically includes a p-well region and a laterally displaced n-well region. First and second conductive gate structures are then formed on an upper surface of the gate dielectric layer. The first conductive gate is positioned over the p-well region while the second conductive gate is positioned over the n-well region. An n-channel mask is then formed on the substrate. The n-channel mask covers the n-well regions of the semiconductor substrate and the second conductive gate structure. After the n-channel mask has been formed, a first impurity distribution is introduced into the p-well regions. The first impurity distribution preferably includes a species of fluorine or nitrogen. A n-type impurity distribution is then introduced into the p-well regions of the semiconductor substrate. The n-type impurity distribution is self aligned with the first conductive gate structure and comprises an impurity of arsenic or phosphorous. A p-channel mask is then formed on the semiconductor substrate. The p-channel mask covers the p-well regions of the semiconductor substrate in addition to the first conductive gate structure. After the gate channel mask is formed, a p-type impurity distribution such as boron is introduced into the n-well regions and into the second conductive gate structure. After removing the p-channel mask (and the n-channel mask) an electrically neutral impurity is then introduced into the semiconductor substrate. The electrically neutral impurity amorphizes the semiconductor substrate to limit the subsequent redistribution of source/drain impurity distributions thereby resulting in the formation of shallow junctions. Thereafter, spacer structures are formed on sidewalls of the first and second conductive gate structures, and forming the spacer structures, n+ and p+ source/drain impurity distributions are introduced into the p and n well regions of the semiconductor substrate respectively.

In one embodiment, the process further includes prior to the formation of the n-channel and p-channel masks, depositing a sacrificial dielectric layer over the topography comprised of the first and second conductive gate structures and the upper surface of the semiconductor substrate. Preferably, the semiconductor substrate is a silicon wafer, and still more preferably includes a p-type epitaxial layer formed on a p+ silicon bulk. The formation of the gate dielectric in the preferred embodiment is accomplished by immersing the semiconductor substrate in an oxygen bearing ambient maintained at a temperature in the range of approximately 500° C. to 900° C. In the preferred embodiment, the formation of the first and second conductive gate structures includes depositing polysilicon, doping the polysilicon with an impurity concentration and patterning the polysilicon with a photolithography and plasma etch process. The deposition of polysilicon is preferably accomplished by thermally decomposing silane in a chemical vapor deposition reactor chamber maintained at a temperature in the range of approximately 580° C. to 650° C. The impurity concentration used to dope the polysilicon is preferably sufficient to reduce a sheet resistivity of the polysilicon to less than approximately 500 Ω/square.

Introduction of the first impurity distribution, in a presently preferred embodiment, comprises implanting the first impurity distribution using an implant energy in the range of approximately 50 keV and implant dose in the range of approximately $1\times10^{14}$ to $5\times10^{15}$ atoms/cm$^2$. Similarly, the introduction of the n-type impurity distribution preferably includes implanting arsenic or phosphorous into the p-well regions using an implant energy in the range of approximately 10 to 50 keV and an implant dose of less than approximately $1\times10^{15}$ atoms/cm$^2$. The introduction of the p-type impurity distribution preferably includes implanting boron into the n-well regions using an implant energy in the range of approximately 10 to 50 keV and an implant dose of less than approximately $1\times10^{15}$ atoms/cm$^2$. The electrically neutral impurity distribution preferably comprises silicon, germanium, or argon. The introduction of the electrically neutral impurity into the semiconductor substrate is preferably accomplished using an ion implantation at an energy in the range of approximately 10 to 100 keV and a dose of approximately $1\times10^{14}$ to $5\times10^{15}$ atoms/cm$^2$.

The formation of the spacer structures is preferably accomplished by depositing a conformal dielectric layer comprising silicon and oxygen onto a topography that includes the semiconductor substrate and the conductive gate structures. Thereafter, the conformal dielectric layer is etched back with an anisotropic etch process. Preferably, the deposition of the conformal layer is accomplished by decomposing TEOS in a plasma enhanced chemical vapor deposition reactor chamber maintained at a temperature in the range of approximately 250° C. to 750° C.

The present invention further contemplates a method of fabricating a CMOS integrated circuit. The method includes forming first and second transistor gates over a p-well region and an n-well, respectively, of a semiconductor substrate. An implant is then performed into the p-well regions of the semiconductor substrate where the implant species is nitrogen or fluorine. An n-LDD impurity distribution is then implanted into the p-well regions. The n-LDD impurity distribution is comprised of arsenic or phosphorous. A p-LDD impurity distribution comprising boron is then implanted into the n-well regions of the semiconductor substrate. An amorphizing impurity distribution comprised of argon, silicon or germanium is then implanted into the p-well and n-well regions of the semiconductor substrate. Spacer structures are then formed on sidewalls of the first and second conductive gates and source/drain impurity distributions are introduced into the semiconductor substrate.

BRIEF DESCRIPTION OF THE DRAWINGS

Other objects and advantages of the invention will become apparent upon reading the following detailed description and upon reference to the accompanying drawings in which.

Figure 1:
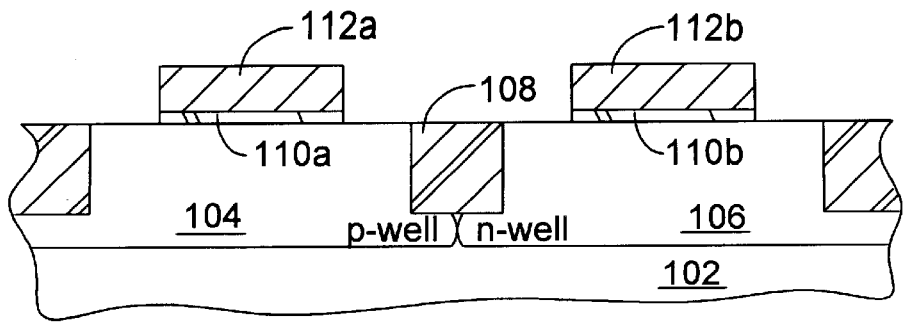
FIG. 1 is a partial cross-sectional view of a semiconductor substrate including a p-well and a laterally displaced n-well upon which first and second conductive gate structures have been formed.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIG. 1 shows a semiconductor substrate 102 which includes a p-well region 104 laterally displaced and adjacent to an n-well region 106. P-well region 104, as will be appreciated to those skilled in the art, includes an impurity distribution of a p-type impurity such as boron, while n-well 106 includes an impurity distribution of an n-type dopant such as phosphorous or arsenic. Preferably, the starting material used for semiconductor substrate 102 comprises a single crystal silicon wafer with a diameter of approximately 150 mm or 200 mm. In an embodiment useful in the fabrication of CMOS integrated circuits, the starting material for semiconductor substrate 102 typically includes a p-type epitaxial layer formed over a p+ silicon bulk wherein a resistivity of the p-type epitaxial layer is in the range of approximately 10 to 15 Ω-cm. For purposes of this disclosure, a p+ or n+ designation refers to an impurity concentration in excess of approximately $10^{19}$ atoms/cm$^2$. P-well and n-well regions such as p-well region 104 and n-well region 106 are commonly associated with the fabrication of CMOS integrated circuits wherein n-type transistors are formed in p-well region 104 while p-type transistors are formed in n-well region 106. Semiconductor substrate, as disclosed in FIG. 1, further includes isolation structures represented by reference numeral 108. Isolation structures 108, as their name implies, isolate individual transistors within an integrated circuit so that the individual transistors are not inadvertently coupled to each other during circuit operation. The particular isolation structure 108 shown in FIG. 1 comprises a shallow trench isolation structure in which a dielectric material is deposited into a trench etched into semiconductor substrate 102 and subsequently planarized to remove portions of the dielectric material from regions exterior to the trench. Isolation structures of this type are typically fabricated by using a chlorine bearing plasma etch process to anisotropically etch an isolation trench into semiconductor substrate 102. Subsequently, the dielectric material is deposited, using for example, a plasma enhanced chemical vapor deposition process with a TEOS source. Planarization of the structure may be accomplished using a chemical mechanical polish or a photoresist/etchback process. FIG. 1 further includes a pair of conductive gate structures 112a and 112b fabricated over a pair of gate dielectric structures 110a and 110b. Typically, conductive gate structures 112a and 112b comprise a conductive material such as heavily doped polysilicon, aluminum, copper, or tungsten. In one embodiment, the formation of conductive gate structures 112a and 112b is accomplished by thermally decomposing silane in a chemical vapor deposition reactor chamber maintained at a temperature of approximately 580° C. to 650° C. Subsequently, the deposited polysilicon is doped with an impurity to reduce a sheet resistivity of the polysilicon to less than approximately 500 Ω per square. The doping of the as-deposited polysilicon is suitably accomplished in one embodiment with an ion implantation process. In the preferred CMOS embodiment, conductive gate structures, such as conductive gate structure 112a, which are situated over p-well region such as p-well 104, are doped with an n-type impurity while conductive gate structures such as conductive gate structure 112b situated over n-well region 106 are doped with a p-type impurity distribution. The doping of the conductive gate structures may be accomplished, in alternative embodiments, either before or after the etch process used to pattern the deposited polysilicon layer. In addition, a photoresist mask may be required to selectively introduce p-type impurity distributions into the conductive gate structures situated over n-well regions and to introduce n-type impurity distribution selectively into the conductive gate structures situated over p-well regions. Gate dielectric structures 110a and 110b are typically formed prior to the formation of conductive gate structures 112a and 112b by immersing semiconductor substrate 102 into an oxygen bearing ambient maintained at a temperature in the range of approximately 500° C. to 900° C. to produce a thermal silicon dioxide film having a thickness in the range of approximately 15 to 60 angstroms.

Figure 2:
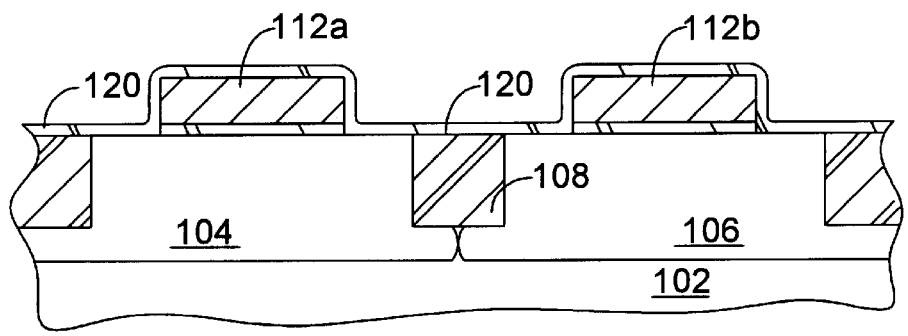
FIG. 2 is a processing step subsequent to FIG. 1 in which a thin dielectric layer has been deposited over the semiconductor substrate topography.

Turning now to FIG. 2, an optional processing step is shown in which a sacrificial dielectric layer 120 is deposited over the topography comprising the first and second conductive gate structures 112a and 112b and semiconductor substrate 102. Depending upon the etch process used to pattern conductive gate structures 112a and 112b, portions of the gate dielectric film not located under the patterned conductive gate structures may be removed during the gate etch process. In such an embodiment, it may be desirable to introduce a sacrificial dielectric layer such as layer 120 to protect semiconductor substrate 102 from excessive lattice damage due to the ion implantation steps that are described below. In a typical embodiment, the formation of sacrificial layer 120 is accomplished using a chemical vapor deposition using a silane or TEOS source. In the preferred embodiment, a thickness of sacrificial dielectric layer 120 is in the range of approximately 500 angstroms.

Figure 3:
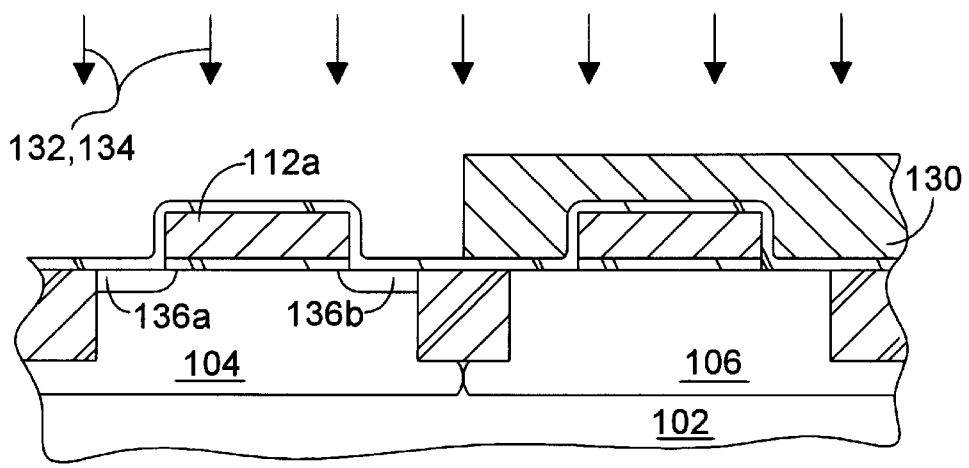
FIG. 3 is a processing sequence subsequent to FIG. 2 in which impurity distributions are introduced into the p-well region of the semiconductor substrate using at least two implant processes.

Turning now to FIG. 3, an impurity distribution 136 is introduced into p-well region 104 of semiconductor substrate 102 using, in the preferred embodiment, a pair of ion implantation processes represented in FIG. 3 by reference numerals 132 and 134. In the preferred embodiment, a first impurity distribution is introduced into the p-well region 104 using ion implantation 132 wherein, a species for ion implantation 132 comprises fluorine or nitrogen. The introduction of fluorine or nitrogen into the p-well regions of the CMOS integrated circuit is believed to facilitate the fabrication of shallow junctions by impeding subsequent redistribution of the n-type source/drain regions. By minimizing the amount of redistribution, the first impurity distribution comprising fluorine or nitrogen is believed to result in a shallower source/drain junction depth and, additionally, a lower sheet resistivity of the source/drain region resulting in reduced contact resistance. In the preferred embodiment, the first ion implantation is accomplished using an implant energy in the range of approximately 10 to 50 keV at an implant dose in the range of approximately $1 \times 10^{14}$ to $5 \times 10^{15}$ atoms/cm$^2$. After the introduction of the first impurity distribution, an n-type impurity distribution is then introduced into p-well regions 104 of semiconductor substrate 102. In the preferred embodiment, the introduction of the n-type impurity distribution is accomplished with an ion implantation process such that the n-type impurity distribution is self aligned with first conductive gate structure 112a. In the presently preferred embodiment, the introduction of the n-type impurity distribution is accomplished using ion implantation process 134. Preferably, ion implantation process 134 uses a arsenic or phosphorous species, an implant energy in the range of approximately 10 to 50 keV, and an implant dose of less than approximately $1 \times 10^{15}$ atoms/cm$^2$. It will be recognized to those skilled in the art that these implant parameters are consistent with the fabrication of an n-LDD region represented by reference numeral 136a and 136b in FIG. 3. A suitable junction depth for LDD regions 136a and 136b is typically less than approximately 0.2 microns. The use of LDD or lightly doped drain regions is known in the field of semiconductor processing to beneficially reduce the maximum electric field that results when the drain terminal of an MOS transistor is biased. Minimizing the maximum electric field is desirable to minimize the occurrence of hot electron injection and other undesired effects that tend to reduce the lifetime and reliability of the MOS transistor. It is to be understood that the first impurity distribution comprising nitrogen or fluorine also resides within the impurity distribution region 136a and 136b. To prevent ion implantations 132 and 134 from entering n-well regions 106 of semiconductor substrate 102, an n-channel mask 130 is formed prior to performing the implants. In the preferred embodiment, n-channel mask 130 comprises a patterned photoresist layer fabricating using conventional photolithography, masking, and photoresist processes.

Figure 4:
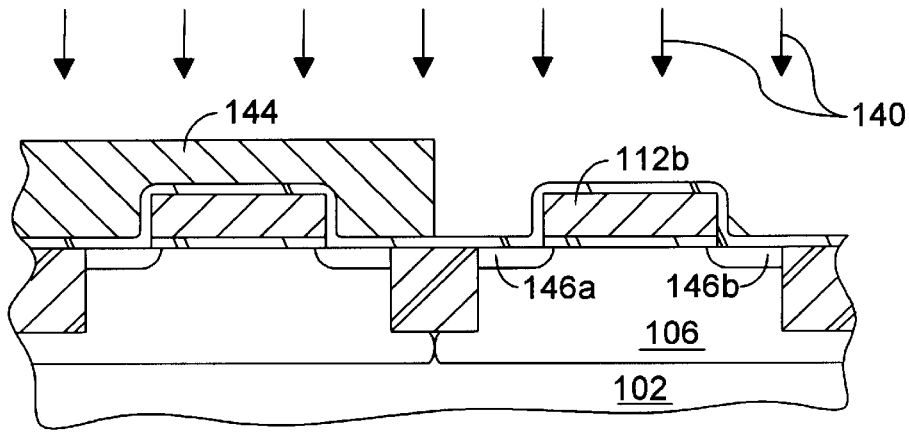
FIG. 4 is a processing sequence subsequent to FIG. 3 in which a p-type impurity distribution is introduced into the n-well region of the semiconductor substrate using an ion implantation process.

Turning now to FIG. 4, a p-type impurity distribution is introduced into n-well regions 106 of semiconductor substrate and into second conductive gate structure 112b to form p-type impurity distribution region 146a and 146b and semiconductor substrate 102 wherein regions 146a and 146b are self aligned to the sidewalls of second conductive gate structure 112b. The preferred method of introducing the p-type impurity distribution into regions 146a and 146b is an ion implantation process represented by reference numeral 140 and FIG. 4. In the preferred embodiment, the ion implantation process 144 is accomplished using an implant energy in the range of approximately 10 to 50 keV at an implant dose of less than approximately $1 \times 10^{15}$ atoms/cm$^2$ using an implant species comprising boron. Those skilled in semiconductor processing will recognize that these parameters are consistent with the formation of a p-LDD impurity distribution useful for reducing the maximum electric field generated by the p-channel transistors during circuit operation. P-type impurity distribution of ion implantation 140 is prevented from entering the p-well regions 104 of semiconductor substrate 102 through the use of a p-channel implant mask 144. P-channel implant mask 144 is suitably comprised of a patterned photoresist layer patterned such that n-well regions of the semiconductor substrate 102 are exposed while p-well regions of the substrate are covered by the patterned mask. Formation of the patterned masking layer is suitably accomplished with conventional photolithography, photoresist, and masking techniques.

Figure 5:
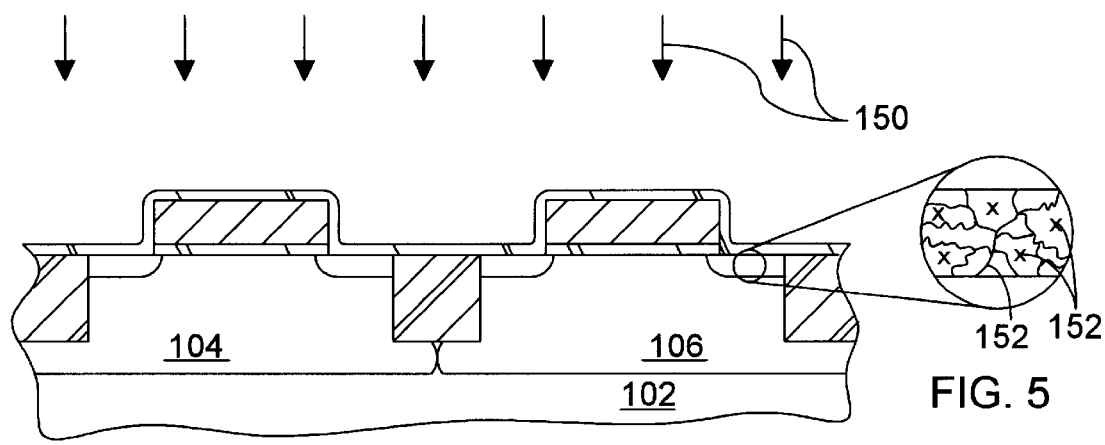
FIG. 5 is a processing sequence subsequent to FIG. 4 in which a blanket implant of an electrically neutral or inert implant species is introduced into the semiconductor substrate.

Turning now to FIG. 5, p-channel implant mask 144 has been removed from the semiconductor substrate and an electrically neutral impurity is introduced into semiconductor substrate to amorphize substrate 102. The amorphization of a semiconductor substrate further facilitates the fabrication of shallow junctions by creating an amorphous silicon substrate. The amorphous silicon substrate is less prone to channeling and otherwise reduces the mobility of impurity located within the substrate. Preferably, the amorphization of semiconductor substrate 102 is accomplished by implanting an electrically neutral impurity distribution into the semiconductor substrate. The ion implantation process used to amorphize the semiconductor substrate is represented in FIG. 5 by reference numeral 150. In a presently preferred embodiment, ion implantation 150 is suitably carried out using a species of silicon, germanium, or argon. The presence of the electrically neutral impurity distribution is indicated within the magnified view of FIG. 5 by reference numeral 152. The ion implantation process 150 is preferably accomplished using an implant energy in the range of approximately 10 to 100 keV and an implant dose of approximately $1 \times 10^{14}$ to $5 \times 10^{15}$ atoms/cm$^2$. The amorphous structure of the semiconductor substrate after the ion implantation 150 is indicated in the magnified view of FIG. 5 by the irregular lines 153.

Figure 6:
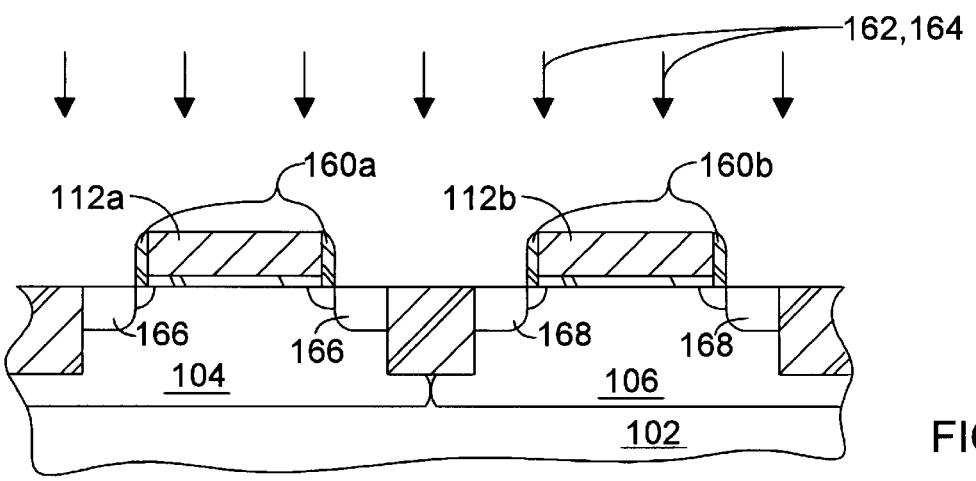
FIG. 6 is a processing step subsequent to FIG. 5 in which spacer structures are formed on the sidewalls of the conductive gate structures and source/drain impurity distributions introduced into the semiconductor substrate; and, FIG. 7 is a partial cross-sectional view of an MOS transistor.
Figure 7:
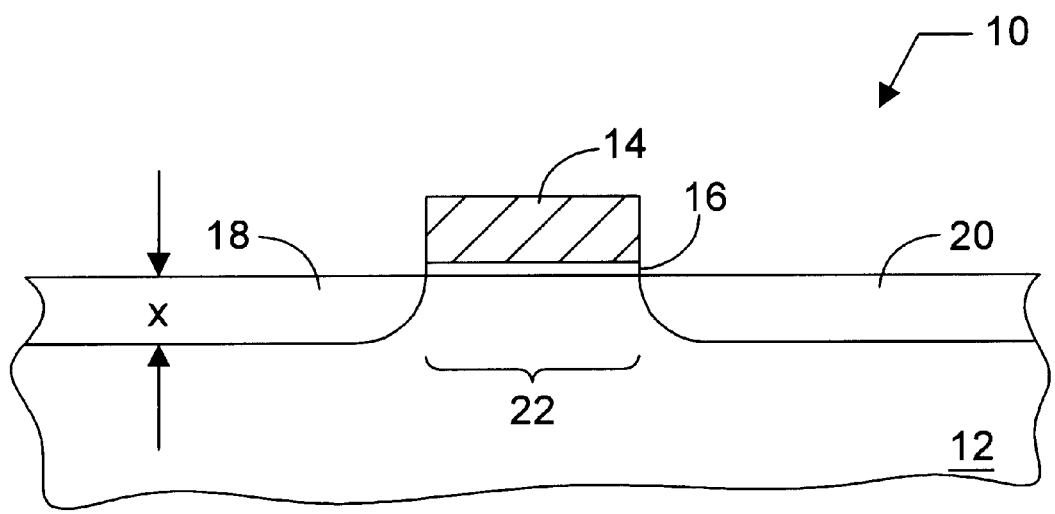

Turning now to FIG. 6, completion of the CMOS integrated circuit is accomplished by forming heavily doped source/drain regions and spacer structures. More specifically, spacer structures represented by reference numerals 160a and 160b are fabricated on the sidewalls of first conductive gate 112a and second conductive gate 112b, respectively. The fabrication of spacer structures is accomplished in a presently preferred embodiment by chemically depositing a substantially conformal dielectric layer and thereafter performing an anisotropic plasma etch process. A suitable method of depositing the conformal dielectric layer includes decomposing TEOS or silane in a CVD reactor chamber maintained at a temperature in the range of approximately 250° C. to 700° C. The subsequent anisotropic etch process results in the removal of portions of the conformal dielectric layer over those regions of the underlying topography and is substantially parallel to an upper surface of semiconductor substrate 102. In this manner, spacer structures are left behind after the etch process on the substantially vertical sidewalls of conductive gates 112a and 112b. In addition to forming a more forgiving topography for a subsequent deposition process, spacer structures are useful because they provide an implant mask for those regions of the semiconductor substrate in close proximity to the sidewalls of the conductive gate structures 112. With the spacer structures 160 in place, an n-type source/drain impurity distribution 166 and a p-type source/drain impurity distribution 168 may be introduced into p-well regions 104 and n-well regions 106, respectively, of semiconductor substrate 102 using n+ ion implantation process 162 and p+ ion implantation process 164. To achieve the proper selectivity, the implantation processes 162 and 164 may be performed in the presence of n+ and p+ photoresist masks similar to the mask used and described with respect to FIGS. 3 and 4. N+ and p+ ion implantation processes are typically accomplished using an implant energy greater than approximately $1 \times 10^{15}$ atoms/cm$^2$. A suitable species for n+implant includes phosphorous or arsenic, while a suitable implant species for p+ implant 164 includes boron. An additional implant (not shown in the FIGS.) may be performed following the spacer etch. In this optional implant, silicon or other electrically neutral impurity distribution is introduced into semiconductor substrate 102 to further amorphize the semiconductor substrate and to produce a silicon rich upper surface which may be useful in facilitating a subsequent salicidation process. In another embodiment, an optional fluorine bearing implant may be performed prior to ion implantation process 162 to further introduce a redistribution inhibiting impurity distribution into the p-well regions of the CMOS integrated circuit.

The presence of the amorphized silicon substrate upper region coupled with the presence of the nitrogen or fluorine bearing impurity distribution within the n-channel regions of the semiconductor substrate is believed to result in a CMOS integrated circuit that can demonstrate improved resistance to subsequent high temperature processing steps. If, for example, it is necessary to anneal semiconductor substrate 102 to electrically activate the impurity distributions introduced into semiconductor substrate 102 by the various implant processes, it is believed that the n+regions and the LDD regions of the CMOS integrated circuit will exhibit less redistribution, contain a higher peak impurity concentration, and result in lower contact resistances and lower sheet resistances of the source/drain regions.

It will be appreciated to those skilled in the art that the present invention is useful in fabricating a high performance shallow junction CMOS integrated circuit. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A semiconductor process comprising:

providing a semiconductor substrate, wherein said semiconductor substrate comprises a p-well region and a laterally displaced n-well region;

forming a gate dielectric layer on an upper surface of said semiconductor substrate;

forming first and second conductive gate structures on an upper surface of said gate dielectric layer, said first conductive gate structure positioned over said p-well region and said second conductive gate positioned over said n-well region;

forming an n-channel mask on said semiconductor substrate, wherein said n-channel mask covers said n-well regions of said semiconductor substrate and said second conductive gate structure;

after forming said n-channel mask:

introducing a first impurity distribution into said p-well regions, wherein said first impurity distribution comprises a species selected from the group of fluorine and nitrogen; and introducing an n-type impurity distribution into said p-well regions of said semiconductor substrate, wherein said n-type impurity distribution is self aligned with said first conductive gate structure;

forming a p-channel mask on said semiconductor substrate; wherein said p-channel mask covers said p-well regions of said semiconductor substrate and said first conductive gate structure;

after forming said p-channel mask, introducing a p-type impurity distribution into said n-well regions and into said second conductive gate structure, wherein said p-type impurity distribution comprises boron;

after removing said p-channel mask and said n-channel mask, introducing an electrically neutral impurity into said semiconductor substrate to amorphize said semiconductor substrate;

forming spacer structures on sidewalls of said first and second conductive gate structures; and after forming said spacer structures, implanting n+ and p+ source/drain impurity distributions into said p-well and said n-well regions respectively.

2. The process of claim 1 further comprising, prior to the steps of forming said n-channel and p-channel masks, depositing a sacrificial dielectric layer over a topography comprising said first and second conductive gate structures and said upper surface of said semiconductor substrate.

3. The process of claim 1, wherein said semiconductor substrate comprises a p-type epitaxial layer formed on a p+ silicon bulk.

4. The process of claim 1, wherein the step of forming said gate dielectric comprises immersing said semiconductor substrate in an oxygen bearing ambient maintained at a temperature in the range of approximately 500 to 900° C.

5. The process of claim 1, wherein the step of forming said first and second conductive gate structures comprise:

depositing polysilicon by thermally decomposing silane in a chemical vapor deposition reactor chamber maintained at a temperature in the range of approximately 580 to 650° C.;

doping said polysilicon with an impurity concentration sufficient to reduce a sheet resistivity of said polysilicon to less than approximately 500 $\Omega$/square; and patterning said polysilicon layer by photolithography and plasma etching.

6. The process of claim 1, wherein the step of introducing said first impurity distribution comprises implanting at an implant energy in the range of approximately 10 to 50 keV and an implant dose in the range of approximately $1\times10^{14}$ to $5\times10^{15}$ atoms/cm$^2$.

7. The process of claim 1, wherein said n-channel mask comprises photoresist.

8. The process of claim 1, wherein the step of introducing said n-type impurity distribution comprises implanting arsenic or phosphorous into said p-well regions at an implant energy in the range of approximately 10 to 50 keV and using an implant dose less than approximately $1\times10^{15}$ atoms/cm$^2$.

9. The process of claim 1, wherein the step p-channel mask comprises photoresist.

10. The process of claim 1, wherein the step of introducing said p-type impurity distribution comprises implanting boron into said n-well regions at an implant energy in the range of approximately 10 to 50 keV and using an implant dose less than approximately $1\times10^{15}$ atoms/cm$^2$.

11. The process of claim 1, wherein said electrically neutral impurity distribution comprises Si, Ge, or Argon.

12. The process of claim 11, wherein the step of introducing said electrically neutral impurity comprises ion implanting at an energy in the range of approximately 10 to 100 keV and a dose of approximately $1\times10^{14}$ to $5\times10^{15}$ atoms/cm$^2$.

13. The process of claim 1, wherein the step of forming said spacer structures comprises:

depositing a conformal dielectric layer comprising silicon and oxygen onto a topography comprising said semiconductor substrate and said conductive gate structures; and etching back said conformal dielectric layer with anisotropic etching.

14. The process of claim 13, wherein the step of depositing said conformal dielectric layer comprises decomposing TEOS is a plasma enhanced CVD reactor chamber maintained at a temperature in the range of approximately 250° C. to 750° C.

15. A method of fabricating a CMOS integrated circuit, said method comprising:

providing a semiconductor substrate, wherein said semiconductor substrate includes a p-well region and a laterally displaced n-well region;

forming first and second transistor gates over said p-well region and said n-well region respectively of said semiconductor substrate, and thereafter;

implanting a first impurity distribution comprising nitrogen or fluorine into p-well regions of said semiconductor substrate;

implanting an n-LDD impurity distribution comprising arsenic or phosphorous into said p-well regions;

implanting a p-LDD impurity distribution comprising boron into said n-well regions of said semiconductor substrate;

implanting an amorphizing impurity distribution comprising Ar, Si, or Ge into said p-well and n-well regions of said semiconductor substrate;

forming spacer structures on sidewalls of said first and second conductive gates; and implanting source/drain impurity distributions into said semiconductor substrate.

16. The method of claim 15, wherein the step of implanting said first impurity distribution is accomplished using an implant energy in the range of approximately 10 to 50 keV and an implant dose in the range of approximately $1\times10^{14}$ to $5\times10^{15}$ atoms/cm$^2$.

17. The method of claim 15, wherein the step of implanting said n-LDD impurity distribution is accomplished using an implant energy in the range of approximately 10 to 50 keV and an implant dose of less than approximately $1\times10^{15}$ atoms/cm$^2$.

18. The method of claim 15, wherein the step of implanting said p-LDD impurity distribution is accomplished using an implant energy in the range of approximately 10 to 50 keV and an implant dose of less than approximately $1\times10^{15}$ atoms/cm$^2$.

19. The method of claim 15, wherein the step of implanting said amorphizing impurity distribution is accomplished using an implant energy in the range of approximately 10 to 100 keV using an implant dose in the range of approximately $1\times10^{14}$ to $5\times10^{15}$ atoms/cm$^2$.

20. The method of claim 15, wherein the step of implanting said s/d impurity distributions is accomplished using an implant energy in the range of approximately 20 to 100 keV and an implant dose in excess of $1\times10^{15}$ atoms/cm$^2$.

* * * * *